United States Patent
Davis, III

(12) 
(10) Patent No.: US 6,478,533 B2
(45) Date of Patent: Nov. 12, 2002

(54) METHOD OF USING A TUBE FEEDER FOR CIRCUIT BOARD COMPONENTS

(76) Inventor: Maurice M. Davis, III, 210 Kethcum Rd., Conklin, NY (US) 13748

( * ) Notice: Subject to any disclaimer, the term of this patent is extended or adjusted under 35 U.S.C. 154(b) by 152 days.

(21) Appl. No.: 09/777,855

(22) Filed: Feb. 7, 2001

(65) Prior Publication Data

US 2001/0008042 A1 Jul. 19, 2001

Related U.S. Application Data

(62) Division of application No. 09/482,330, filed on Jan. 14, 2000, now Pat. No. 6,385,842.

(51) Int. Cl.$^7$ .............................................. B65G 47/24
(52) U.S. Cl. ......................... 414/816; 29/740; 198/406
(58) Field of Search ............................... 29/564.1, 740, 29/741, 743, 753, 759, 809, 823; 198/389, 391, 406; 294/2, 64.1; 414/403, 737, 752, 754, 798.6, 816

(56) References Cited

U.S. PATENT DOCUMENTS

| | | |
|---|---|---|
| 3,308,977 A | 3/1967 | Cochran et al. |
| 4,293,998 A | 10/1981 | Kawa et al. |
| 4,346,514 A | 8/1982 | Makizawa et al. ............ 29/740 |
| 4,403,726 A | 9/1983 | Snyder et al. |
| 4,507,862 A | 4/1985 | Kukowski et al. |
| 4,567,652 A | 2/1986 | Gussman et al. ............. 29/837 |
| 4,599,026 A | 7/1986 | Feiber et al. |
| 4,611,397 A | 9/1986 | Janisiewicz et al. |
| 4,631,812 A | 12/1986 | Young |
| 4,733,459 A | 3/1988 | Tateno ......................... 29/741 |
| 4,862,578 A | 9/1989 | Holcomb |
| 4,872,258 A | 10/1989 | Ragard |
| 4,917,561 A | 4/1990 | Biesecker et al. |
| 4,927,001 A * | 5/1990 | Hendricks ................ 198/463.5 |

(List continued on next page.)

FOREIGN PATENT DOCUMENTS

| | | |
|---|---|---|
| JP | 56-78717 | 6/1981 |
| JP | 57-95693 | 6/1982 |
| JP | 59-23600 | 2/1984 |
| JP | 59-99799 | 6/1984 |
| JP | 59-99800 | 6/1984 |
| JP | 59-124800 | 7/1984 |
| JP | 59-129496 | 7/1984 |
| JP | 59-129497 | 7/1984 |
| JP | 59-146328 | 8/1984 |
| JP | 59-222999 | 12/1984 |
| JP | 60-148197 | 8/1985 |
| JP | 59-100468 | 12/1985 |
| JP | 60-244713 | 12/1985 |
| JP | 62-96027 | 5/1987 |
| JP | 62-101096 | 5/1987 |
| JP | 62-121126 | 6/1987 |
| JP | 62-146819 | 6/1987 |
| JP | 62-146820 | 6/1987 |
| JP | 62-146821 | 6/1987 |
| JP | 62-146824 | 6/1987 |
| JP | 60-16499 | 1/1995 |

OTHER PUBLICATIONS

"Nozzle Application"; Catalog; Universal; p. 13; 1996.

"Multi–Tube Feeder"; for the Universal GSM; 1999.

AMP Incorporated "Exacton Robotic Modules—Slide–Pack Feeder", sales brochure 1987.

*Primary Examiner*—Janice L. Krizek
(74) *Attorney, Agent, or Firm*—Burns, Doane, Swecker & Mathis, L.L.P.

(57) ABSTRACT

A method of picking up components for delivery to a circuit board in a pick and place machine includes moving a plurality of components along a channel from a receiving location to a pick-up location; moving the components to an elevated zone at the pick-up location; pivoting the components on the elevated zone to a desired orientation; and picking up the components with a pick-up head.

16 Claims, 3 Drawing Sheets

U.S. PATENT DOCUMENTS

| | | | |
|---|---|---|---|
| 4,955,653 A | 9/1990 | Beals | |
| 4,995,157 A | 2/1991 | Hall | 29/740 |
| 5,029,383 A | 7/1991 | Snyder et al. | |
| 5,035,316 A | 7/1991 | Coates et al. | |
| 5,105,528 A | 4/1992 | Soth et al. | |
| 5,123,516 A * | 6/1992 | Moore | 198/396 |
| 5,201,696 A | 4/1993 | Kinback et al. | |
| 5,337,465 A | 8/1994 | Tamaki et al. | 29/740 |
| 5,452,824 A | 9/1995 | Danek et al. | |
| 5,456,510 A | 10/1995 | Coots et al. | |
| 5,458,388 A | 10/1995 | Danek et al. | |
| 5,649,356 A | 7/1997 | Gieskes | |
| 5,733,093 A | 3/1998 | Palm et al. | |
| 5,739,846 A | 4/1998 | Gieskes | |
| 5,743,001 A | 4/1998 | Baker et al. | |
| 5,852,869 A | 12/1998 | Gieskes et al. | |
| 6,105,753 A | 8/2000 | Graham | 198/763 |
| 6,116,822 A | 9/2000 | Teoh et al. | 406/180 |
| 6,126,376 A | 10/2000 | Peterson | 414/403 |
| 2001/0008042 A1 * | 7/2001 | Davis, III | 29/740 X |

\* cited by examiner

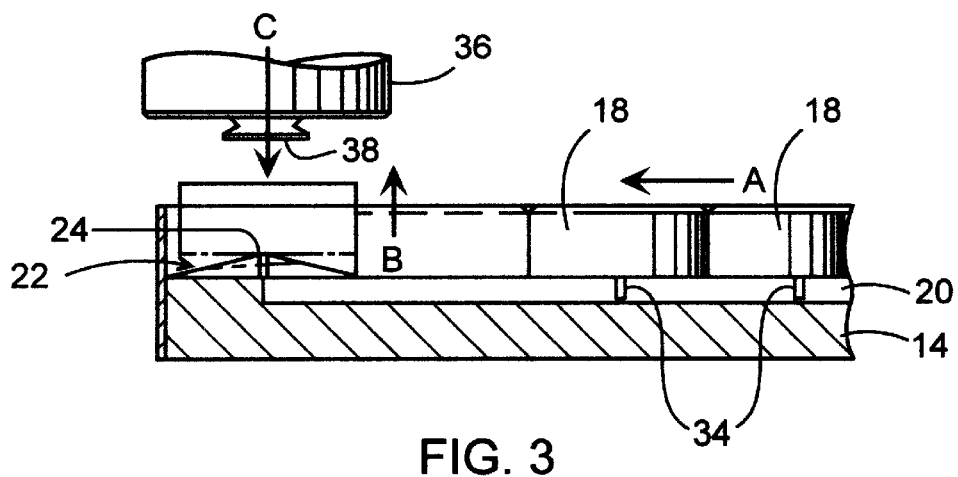
FIG. 3
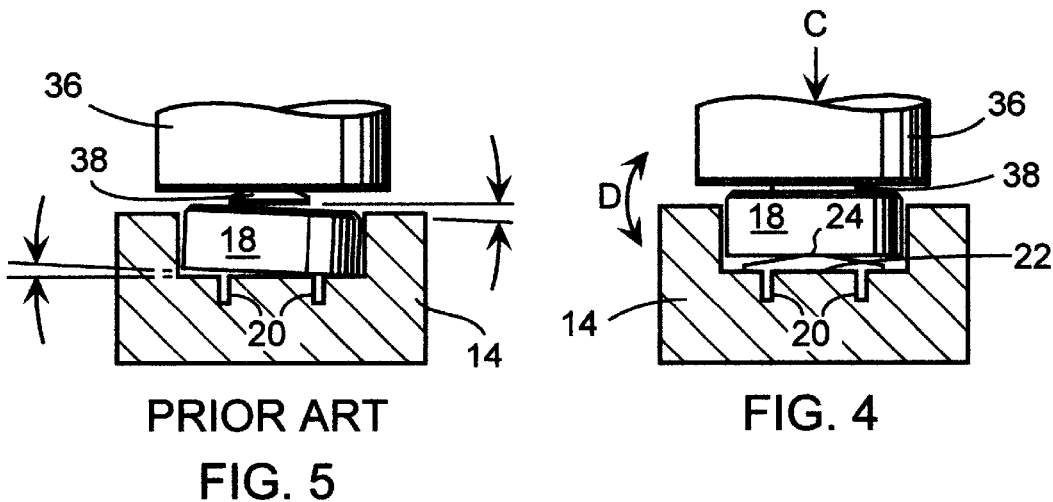
PRIOR ART
FIG. 5
FIG. 4
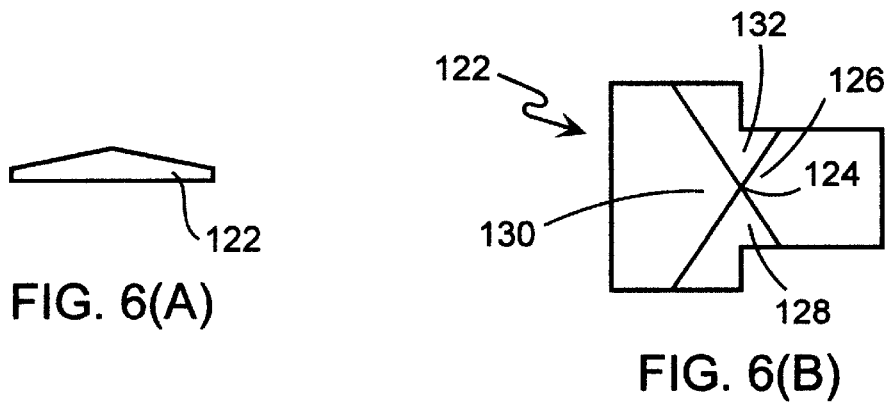
FIG. 6(A)
FIG. 6(B)

METHOD OF USING A TUBE FEEDER FOR CIRCUIT BOARD COMPONENTS

This is a division of application Ser. No. 09/482,330, filed Jan. 14, 2000, now U.S. Pat. No. 6,385,842.

BACKGROUND OF THE INVENTION

1. Field of the Invention

The present invention relates to an apparatus and method for feeding components to an apparatus which automatically places the components on a substrate, such as a printed circuit board or the like.

2. Description of Related Art

Automated equipment exists for picking up a component to be placed on a substrate, such as a printed circuit board or the like and rapidly placing the component into its selected place on the printed circuit board for mounting thereon. Such equipment frequently uses a head for picking up the component and carrying it to the appropriate place on the printed circuit board. The head is usually movable in X, Y, Z, coordinate axes. The placement head shuttles between a pick-up location where one or more components are delivered and the appropriate place on the circuit board for mounting the component.

Such machines are referred to as pick and place machines, and include machines which are manufactured and marketed by Universal Instruments Corporation of Binghamton, N.Y., under the designation "General Surface Mount Application Machines" or "GSM". U.S. Pat. No. 5,649,356 relates to automated pick and place machines.

The known pick and place machines typically distinguish between components of a conventional shape, such as a substantially rectilinear integrated circuit chip, and such components known as "odd form" components which could include a number of different components of an irregular shape. Such odd form components include USB plugs, MINI DIN sockets, phone jacks transformers, crystals, switches, relays, speakers, transformers, capacitors, and many other different types of components. The present invention can be used with both odd form components, as well as with conventionally shaped rectilinear components.

Some known pick and place machines utilize a tube feeder which feeds the components to the pick-up location within the pick and place machine. One such tube feeder is the "Multi-Tube Feeder for the Universal GSM" manufactured and distributed by Universal Instruments Corporation of Binghamton, N.Y. Pending U.S. patent application Ser. No. 09/337,894, the subject matter of which is hereby incorporated herein in its entirety by reference, discloses a tube feeder, and is assigned to the assignee of the present application. U.S. Pat. No. 4,862,578 also discloses a tube feeder.

The pick and place head may include a vacuum head connected to a vacuum source for grabbing the components through a rigid vacuum nozzle presented to the component. For many conventionally shaped components, the vacuum nozzle of the vacuum head can easily find a flat, planar surface on the conventional component for making sufficient contact. However, some components, including some of the odd form components, do not include a predictable geometric shape that consistently presents a flat surface for the vacuum nozzle of the vacuum head to sealingly contact the component. In some situations, the configuration of the odd form component causes the component to wobble or tip slightly as it proceeds along the tube feeder to the pick-up location where it is received by the pick and place machine's vacuum head. In addition, leads or burrs extending from the component may cause the component to wobble, rotate, or otherwise not present itself in a proper orientation for pick-up by the head.

As a result, when the component is delivered to the pick-up location on the tube feeder, the surface to which the head is intended to make contact may be presented at an angle with respect to the head. For example, the surface of the component to which the head is intended to make contact may be presented at an angle with respect to the plane in which the vacuum nozzle resides. In such a case, the vacuum head may not be able to make a firm, sealed connection or vacuum with the component. As a result, the component may not be picked up by the vacuum head. When this occurs, delays and/or errors may occur.

In addition to vacuum heads, some pick and place machines utilize gripping fingers to grip a component. See fingers 46, 48 in U.S. Pat. No. 4,955,653, the contents of which are incorporated by reference herein in its entirety. Orientation of the component may also be important for gripping or other types of heads in order to ensure dependable results.

OBJECTS AND SUMMARY

It is an object of the present invention to provide a tube feeder for pick and place machines which enables components to be delivered to a receiving location on the tube feeder in such a manner that the component can be easily picked up by a vacuum head with great predictability.

According to one aspect of the present invention, a tube feeder for feeding a plurality of components to a pick and place machine includes an elongated channel having a first end and a second end. The first end of the channel is arranged so as to receive a component from a source of the components and the second end of the channel has a pick-up location. The pick-up location includes an elevated zone on which the components can pivot.

Another aspect of the present invention includes a method of picking up components for delivery to a circuit board in a pick and place machine comprising the steps of moving a plurality of components along a channel from a receiving location to a pick-up location; moving the components to an elevated zone at the pick-up location; pivoting the components on the elevated zone; and picking up the components with a pick-up head. Interaction between the pick-up head and the components causes the components to be oriented in a preferred orientation for pick-up by the pickup head.

BRIEF DESCRIPTION OF THE DRAWINGS

FIG. 3 is a cross-sectional view taken along line III—III of FIG. 2.

FIG. 4 is a cross-sectional view taken along line IV—IV of FIG. 2.

FIG. 5 is a view of a prior art apparatus that corresponds to the FIG. 4. view.

FIG. 6a is a side elevational view and FIG. 6b is a top plan view of an alternative embodiment of the present invention.

DETAILED DESCRIPTION OF THE PREFERRED EMBODIMENTS

The present invention is a method and apparatus for the high speed and accurate delivery of components to a pick-up location in an automatic pick and place machine. In particular, the present invention relates to an improvement in a tube feeder device to be used with such automatic pick and place machines.

Figure 1:
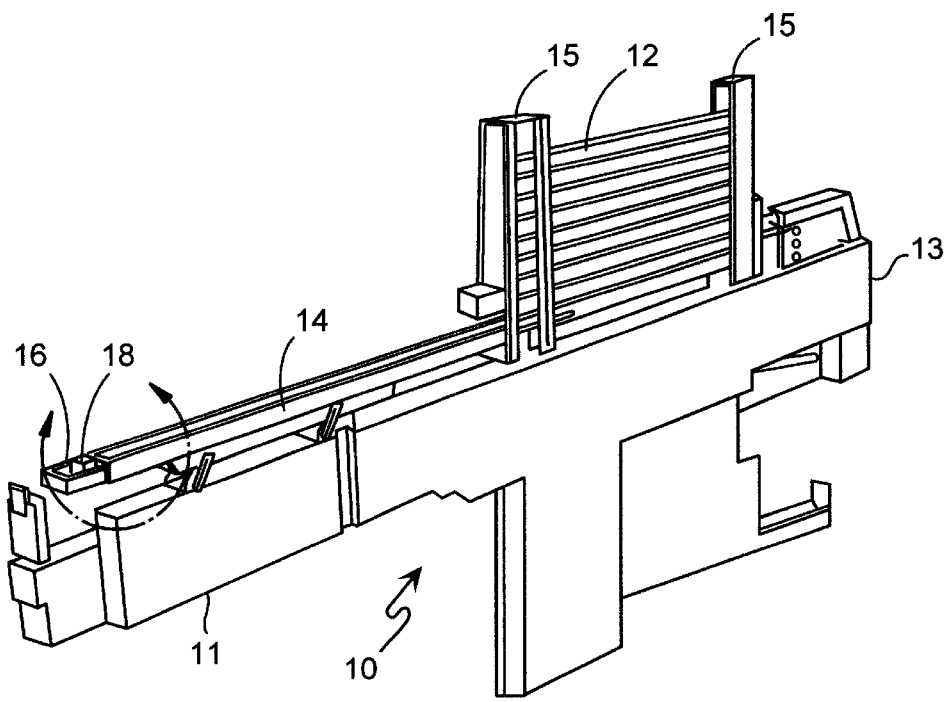
FIG. 1 is a perspective view of a tube feeder used in accordance with the present invention.

A tube feeder 10 according to the present invention is illustrated in FIG. 1. Tube feeders, per se, are known in the prior art, and are intended to be detachably mounted on the automatic pick and place machines in an arrangement that depends upon the particular components to be mounted on a circuit board. The tube feeders come in many different configurations and varying sizes. One preferred embodiment of a tube feeder for use in the present invention is disclosed in the '894 patent application, previously referenced and incorporated herein.

The tube feeder 10 is mounted such that the feeding end 11 is enclosed within a cabinet of the pick and place machine and the opposite end 13 extends outside of the cabinet of the pick and place machine. The opposite end 13 includes a rack 15 for retaining a plurality of feed tubes 12. The components 18 to be mounted on the pick and place machine are arranged within the individual tubes 12. To load the components on the pick and place machine, a plurality of feed tubes 12, each containing a plurality of components 18 to be mounted on the circuit board, are arranged within the rack 15 on the tube feeder 10.

A known mechanism (not shown) extracts the components from the feed tubes 12 and moves the components along an elongated channel 14. The components may be pushed out of the feed tubes 12 by a mechanism at the second end 13 of the tube feeder 10. Alternatively, or in combination, the components may be moved out of the tubes 12, and along the elongated channel 14, by a vibratory mechanism or an air jet (not shown).

Some of the components 18 have leads 34 extending from a bottom side thereof (see FIG. 3). In such a case, the channel 14 is provided with grooves or tracks 20 for receiving and guiding the leads 34 of the components 18.

The preferred embodiment of the present invention is illustrated for use with a plurality of small speakers 18. However, the present invention is adaptable for use with a number of different types of components. As set forth above, some of the many types of components that can be used in accordance with the present invention are MINI DIN sockets, USB plugs, phone jacks, transformers, crystals, switches, relays, audio jacks, speakers, and capacitors, among others. The present invention is most suitable for irregularly shaped components, sometimes referred to as "odd form" components. However, the present invention can be used with other conventional, rectilinearly shaped components, such as IC chips. Such components may be surface mounted components or may be components that are mounted in through holes.

As can be seen in FIG. 3, the components 18 move along the elongated track 14 in the direction of arrow A. A vacuum head 36 moves downwardly in a direction of arrow C so that a rigid vacuum nozzle 38 at a lower end of the vacuum head, typically constructed of a suitable material such as a ceramic, moves down and contacts an upper surface of the component 18. Once sealing contact is made, the component 18 is raised in the direction of arrow B while secured to the vacuum nozzle by the force of the vacuum exerted thereon. As can be seen in FIG. 5, if the component 18 is set at an angle with respect to the vacuum nozzle 38 of the vacuum head 36, the vacuum nozzle 38 will not make a secure, sealed contact with the component 18. Accordingly, in such a case, when the vacuum head 36 retracts, the component 18 will not be withdrawn with the vacuum head 36. Failure to successfully lift the component 18 with the vacuum head 36 causes slow-downs and possibly processing errors in the pick and place machine.

In order to significantly minimize, and possibly even avoid, any failures in picking up the component 18 with the vacuum head 36, the present invention provides a raised zone 22 at the pick-up location of the channel 14. In a preferred embodiment of the present invention illustrated in FIGS. 2–4, the raised zone 22 comprises four planar surfaces 26, 28, 30, 32 which intersect along a straight edge 24. The intersecting edge 24 thus forms a peak of the elevated zone 22. Because the intersecting edge 24 is substantially linear, the component 18 cannot balance on the edge 24. When a component 18 is located in the elevated zone 22, the component can easily pivot from front to back, i.e., over surfaces 26 and 30. In addition, the component is also able to pivot from side to side, i.e., over surfaces 28 and 32.

As illustrated in FIG. 4, when the vacuum head 36 is lowered into place over the component 18, the rigid vacuum nozzle 38 presses downwardly on the component 18. The downward force of the vacuum head 36 on the component 18 causes the component 18 to pivot on the elevated zone 22. Because of the pivoting action of the component 18, represented by arrows D in FIG. 4, the downward pressure of the vacuum head 36 and vacuum nozzle 38 on the component 18 causes the component 18 to automatically align itself in a plane that is substantially perpendicular to the vacuum nozzle 38. Although this plane is usually horizontal, in some embodiments the plane may be set at an angle to the horizontal. As a result, a sufficient contact and good seal may be made between the vacuum nozzle 38 and the component 18.

As a result of this pivoting action, and the enhanced contacts between the vacuum nozzle 38 and the component 18, pick-up omissions and processing errors are substantially reduced, and possibly even eliminated.

Figure 2:
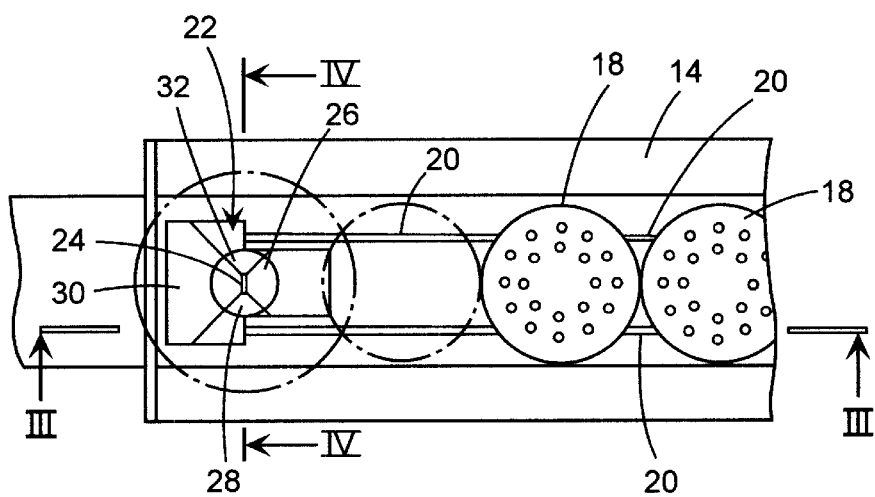
FIG. 2 is a detailed partial top view of the end of the conveyor track of the tube feeder of FIG. 1.
Figure 7A:
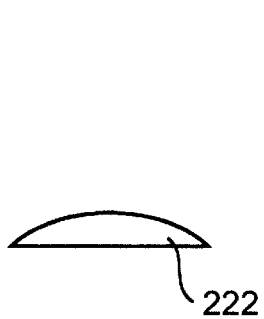
FIG. 7a is a side elevational view and FIG. 7b is a top plan view of another alternative embodiment of the present invention.

As should be clear to those of ordinary skill in the art, there are many alternative embodiments of the present invention that may work instead of the specific arrangement illustrated in FIGS. 2–4. Several such alternative embodiments are illustrated in FIGS. 6–8.

In FIGS. 6*a* and 6*b*, an alternative embodiment is illustrated wherein an elevated zone 122 at the pick-up location of the channel 14 includes four wall surfaces 126, 128, 130, and 132, which intersect at a point 124. Because the four wall surfaces 126, 128, 130, and 132 form a point 124 in the FIG. 6 embodiment, pivoting action is enhanced.

Figure 7B:
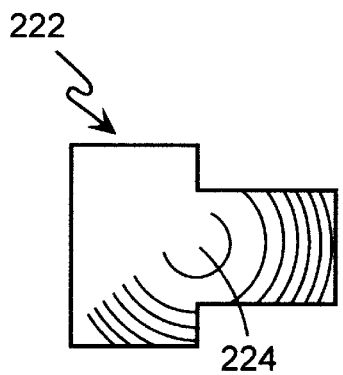

In a third preferred embodiment, an elevated zone 222 of the channel is in the form of a dome. The apex 224 of the dome is illustrated in FIG. 7*b*. The elevated dome 222 provides for uniform pivoting in all 360 degrees.

Figure 8A:
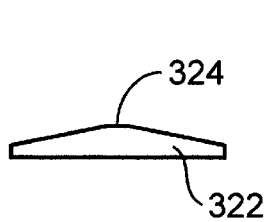
FIG. 8*a* is a side elevational view and FIG. 8*b* is a top plan view of yet another alternative embodiment of the present invention.
Figure 8B:
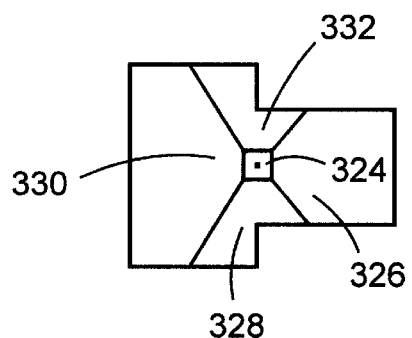

A fourth preferred embodiment is disclosed in FIGS. 8*a* and 8*b*. In the fourth preferred embodiment, the elevated zone 322 includes a horizontal, planar elevated surface 324 that is formed by four intersecting surfaces 326, 328, 330, and 332. In the fourth embodiment, the elevated surface 324 must be sufficiently small so that it does not impede pivoting of the components 18 balanced on top thereof. One of ordinary skill in the art should be able to easily determine a maximum size for the elevated surface 324.

Figure 9:
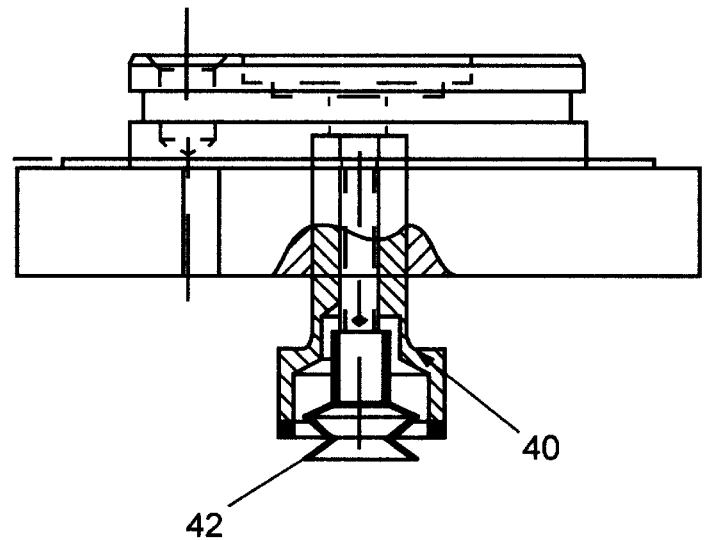
FIG. 9 is a side elevational view, in partial cross-section, of an alternative embodiment of a vacuum head having a resilient suction cup in addition to the rigid vacuum nozzle.

Although the present invention has been described in use with a vacuum head, alternative uses are contemplated as being within the scope of the present invention. Specifically, instead of a vacuum head, a head incorporating mechanical gripping fingers may also be used, such as is shown in the '653 patent, previously referenced and incorporated herein. FIG. 9 illustrates another alternate embodiment wherein a vacuum head 40 includes a resilient suction cup 42 mounted at a lower end thereof within the rigid vacuum nozzle 38. The suction cup 42 may be made of a flexible, resilient material, such as silicone rubber or latex, to assist the vacuum nozzle in making a sealing contact with the component. It should be understood that generally such suction cups generally do not have the strength to lift the component without the vacuum nozzle, nor would a suction cup constructed of a resilient material securely hold the component in a desired position for accurate placement on a substrate such as a printed circuit board.

While particular embodiments of the present invention have been shown and described herein, it is recognized that various modifications thereof will occur to those skilled in the art. Accordingly, the present application is defined by the claims appended hereto, and equivalents thereof.

What is claimed is:

1. A method of picking up components for delivery to a circuit board in a pick and place machine, comprising:

moving a plurality of components along a channel from a receiving location to a pick-up location;

moving the components to an elevated zone at the pick-up location;

pivoting the components on the elevated zone to a desired orientation; and picking up the components with a pick-up head.

2. The method of claim 1, wherein the pivoting step includes applying pressure on the components with the pick-up head so as to orient the components in the desired orientation.

3. The method of claim 1, wherein the channel includes a substantially flat surface and the elevated zone of the pick-up location is higher than the flat surface.

4. The method of claim 1, wherein the components are moved along the channel by a vibratory mechanism.

5. The method of claim 1, wherein the components are moved along the channel by an air jet.

6. The method of claim 1, wherein the channel includes tracks and the components include leads, and the step of moving the components along the channel includes guiding the leads of the components through the tracks of the channel.

7. The method of claim 1, wherein the step of moving the components to the elevated zone includes moving the components up an inclined ramp connecting the channel to the elevated zone.

8. The method of claim 1, wherein the pivoting step pivots the components to a horizontal orientation.

9. The method of claim 8, wherein the pivoting step includes applying pressure on the components with the pick-up head so as to orient the components in the desired orientation.

10. The method of claim 1, wherein the pick-up head picks up the components with a vacuum driven vacuum nozzle.

11. The method of claims 10, wherein the pivoting step includes applying pressure on the components with the pick-up head so as to orient the components in the desired orientation.

12. The method of claim 10, wherein the pivoting step pivots the components to a horizontal orientation.

13. The method of claim 12, wherein the pivoting step includes applying pressure on the components with the pick-up head so as to orient the components in the desired orientation.

14. The method of claim 13, wherein the components are moved along the channel by a vibratory mechanism.

15. The method of claim 13, wherein the components are moved along the channel by an air jet.

16. The method of claim 13, wherein the channel includes tracks and the components include leads, and the step of moving the components along the channel includes guiding the leads of the components through the tracks of the channel.

* * * * *